(12) United States Patent
Kobayashi et al.

(10) Patent No.: US 7,397,257 B2
(45) Date of Patent: Jul. 8, 2008

(54) DETECTION METHOD/DEVICE OF PROBE'S TIP LOCATION USING A TRANSPARENT FILM ATTACHED TO A SUBSTATE HAVING PLURALITY OF ELECTRODES, AND A STORAGE MEDIUM FOR IMPLEMENTING THE METHOD

(75) Inventors: Masahito Kobayashi, Nirasaki (JP); Takanori Hyakudomi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/694,100

(22) Filed: Mar. 30, 2007

(65) Prior Publication Data
US 2007/0229098 A1 Oct. 4, 2007

(30) Foreign Application Priority Data
Mar. 30, 2006 (JP) .............................. 2006-095822

(51) Int. Cl.
*G01R 31/02* (2006.01)
(52) U.S. Cl. ...................................... 324/758; 324/754

(58) Field of Classification Search ....................... None
See application file for complete search history.

(56) References Cited

U.S. PATENT DOCUMENTS

| | | | | |
|---|---|---|---|---|
| 5,321,352 A | * | 6/1994 | Takebuchi | .................... 324/758 |
| 5,644,245 A | * | 7/1997 | Saitoh et al. | ................. 324/754 |
| 2007/0103181 A1 | * | 5/2007 | Strom | ......................... 324/758 |

* cited by examiner

*Primary Examiner*—Paresh Patel
(74) *Attorney, Agent, or Firm*—Oblon, Spivak, McClelland, Maier & Neustadt, P.C.

(57) ABSTRACT

A method for detecting tip positions of probes which is performed prior to the wafer test includes a first step of attaching the transparent film F on the test substrate W having the electrodes P arranged same as those of the wafer; a second step of detecting the electrodes P of the test substrate W by using the first CCD camera 13A; a third step of detecting a surface height of the transparent film F; a fourth step of position-aligning the electrodes P of the test substrate W with the probes 12A. The method further includes a fifth step of forming the probe marks M on the transparent film F by making the probes 12A contact with the transparent film F; and a sixth step of detecting tip positions of the probes 12A based on the electrodes P of the test substrate W and the probe marks M.

16 Claims, 7 Drawing Sheets

DETECTION METHOD/DEVICE OF PROBE'S TIP LOCATION USING A TRANSPARENT FILM ATTACHED TO A SUBSTATE HAVING PLURALITY OF ELECTRODES, AND A STORAGE MEDIUM FOR IMPLEMENTING THE METHOD

FIELD OF THE INVENTION

The present invention relates to a method for detecting tip positions of probes in performing an electrical characteristic test of a test object such as a semiconductor wafer or the like, a storage medium for storing the method and a probe device; and, more particularly, to a method capable of detecting a plurality of tip positions of probes of a probe card with high precision and enhancing reliability of the test, a storage medium for storing the method and a probe device.

BACKGROUND OF THE INVENTION

When an electrical characteristic test of a test object such as a semiconductor wafer or the like is performed by using a probe card, for example, tip positions of probes of the probe card are detected by a camera for capturing images thereof and, then, the probes are made to contact with electrodes of the test object for the electrical characteristic test. In case the tip positions of the probes are detected by the camera, it takes a long time to focus the camera on the ends of the probes, thereby increasing time required to align the test object with the probe card. Therefore, the tip position of the probes is conventionally carried out for a few representative probes. However, in case of fine electrodes, parts of probes may not be properly aligned with the electrodes. Therefore, if possible, it is desirable to detect the tip positions of all of the probes for the alignment between the probes and the wafer.

Further, since various probe cards are developed by a plurality of probe card makers, there are a need to develop a dedicated algorithm for recognizing three-dimensional images of the probes, which incurs considerable costs. Therefore, if the probes can be transcribed on a two-dimensional film, an algorithm can be easily developed.

Therefore, Japanese Patent Laid-open Application No. 2001-189353 (hereinafter, referred to as Reference 1) discloses therein a method and a device for shortening the time needed for inspecting probes. In a technique disclosed therein, probe marks of probes in a probe card are transcribed on a deformable object before the test is carried out and then, insertion depths of the probes into electrodes are obtained based on the opening width of the probe marks, thereby shortening a time required for position-aligning the probes with the electrodes. Further, as for a device for measuring the size of the probe marks and the insertion depths of the probes, a position sensor using an electrostatic capacitance is proposed in Reference 1. Moreover, referring to Reference 1, X and Y coordinates of the probes are detected by using the position sensor having electrodes arranged in a matrix form.

Furthermore, Japanese Patent Laid-open Application No. 2005-308549 (hereinafter, referred to as Reference 2) discloses therein a film for adjusting positions of probes, the film being made from elastomer composition. Herein, the probes are made to contact with the film for adjusting positions of the probes, thus forming probe marks thereon. After a positional relationship between the probe marks and electrodes of an integrated circuit is checked, the positions of the probes are adjusted based on the positional relationship therebetween, if necessary.

Besides, Japanese Patent Laid-open Application No. H2-224260 (hereinafter, referred to as Reference 3) discloses therein a position alignment method. In this method, directions and preset positions of probes are recognized by using camera to detect probe marks of the probes on a dummy wafer.

In addition, Japanese Patent Laid-open Application No. 2005-079253 (hereinafter, referred to as Reference 4) discloses therein an inspecting method. In this method, thermally expanded probes are made to press-contact with a transcription sheet disposed on a support next to a mounting table, thereby leaving probe marks thereon. After the probe marks on the transcription sheet are detected, the thermally expanded probes are position-aligned with the wafer.

Further, Japanese Patent Laid-open Application No. H4-330750 (hereinafter, referred to as Reference 5) discloses therein a method for inspecting a semiconductor wafer. In this method, testing probes leave probe marks on a plate provided on a mounting table, the plate being formed of a transparent resin member. Next, a driving unit is driven based on image information on the probe marks, so that the testing probes are position-aligned with a semiconductor wafer on the mounting table.

Moreover, Japanese Patent Laid-open Application No. H7-147304 (hereinafter, referred to as Reference 6) discloses therein a method for inspecting probes. In this method, a position of a mounting table in X, Y and θ directions is sensed based on a cross-shaped mark serving as a reference point in X and Y directions, the cross-shaped mark being formed at a center of a small alignment member provided next to the mounting table. A position of the mounting table in Z direction is sensed by a electrostatic capacitance sensor and a conductive thin film formed at a periphery of the cross-shaped mark. During an initial test, a probe mark formed on an electrode pad of an initial chip is detected by a CCD camera. Whether post tests will be performed or not is determined based on the detected probe mark.

In case of the technique of Reference 1, although the tip positions and the insertion depths of the probes can be checked based on the probe marks formed on the deformable object, a positional relationship between the probes and a test object is not checked by the deformable body. Further, although Reference 2 discloses therein that it is possible to check the positional relationship between, by making the probe marks on the film for probe position adjustment, the probe mark and the electrodes of the integrated circuit, but it does not embody any technique for checking the positional relationship between the probe marks and the electrodes.

In case of the techniques of References 3 and 4, the probe marks formed on the dummy wafer or the transcription sheet are detected one after another by the imaging unit while moving the mounting table having thereon the wafer. Thus, as the frequency of movement of the mounting table increases, the error in the moving amount is accumulated. Consequently, as the test time passes, the detection accuracy becomes poorer.

The technique of Reference 5 is same as those of References 3 and 4 in that the positions of the probes are detected based on the probe marks formed on the plate provided on a part of the mounting table. In case of the technique of Reference 6, the probe mark formed on the electrode pad of the initial chip is detected during the initial test and, then, whether post tests will be performed or not is determined based on the detected probe mark. Hence, it is not possible to check in advance the positional relationship between the probes and the electrode pads on the entire surface of the wafer.

SUMMARY OF THE INVENTION

It is, therefore, an object of the present invention to provide a method for detecting tip positions of probes, a storage medium for storing the method and a probe device, wherein the method is capable of detecting a positional relationship between the probes and test electrodes of a test object at high speed and with high precision even at a high temperature and thus enhancing reliability of the test.

In accordance with an aspect of the invention, there is provided a method for detecting tip positions of a plurality of probes to perform an electrical characteristic test on a target object to be inspected by making the probes electrically contact with the target object, the method comprising: a first step of attaching a transparent film on a substrate having a plurality of electrodes arranged identical to those of the target object; a second step of detecting the electrodes of the substrate through the transparent film by using an imaging unit; a third step of obtaining a surface height of the transparent film; a fourth step of position-aligning the probes and the electrodes of the substrate which are detected in the second step; a fifth step of forming probe marks on the transparent film by making the probes contact with the transparent film based on the surface height; and a sixth step of detecting the tip positions of the probes based on the electrodes and probe marks on the transparent film.

It is preferable that, in the third step, the surface height of the transparent film is obtained by making a contact sensor contact with a surface of the transparent film.

It is also preferable that, in the third step includes the steps of: measuring an apparent height and an actual height of the substrate by using the imaging unit, and calculating the surface height of the transparent film based on a refractive index of the transparent film and a difference between the measured heights.

It is also preferable that, prior to the fourth step, an overdriving amount of the substrate is determined based on the surface height of the transparent film.

It is also preferable that, further comprising, prior to the third step, the steps of: measuring a thickness of another transparent film attached on the substrate by using a contact sensor, said another transparent film being of a same kind as that of the transparent film attached in the first step; obtaining, as a correction value for a substrate height, a difference between an actual height and an apparent height of the substrate, on which said another transparent film is attached, measured by using the imaging unit; and obtaining the refractive index of the transparent film based on the thickness of said another transparent film and the correction value, wherein, in the third step, the surface height of the transparent film attached in the first step is calculated based on the refractive index thus obtained.

It is also preferable that the third step includes the steps of: measuring in advance respective thicknesses of transparent films having varying thicknesses by using a contact sensor, the transparent films being of a same kind as that of the transparent film; measuring an apparent height and an actual height of the substrate for each of the transparent films by using the imaging unit and obtaining, as a correction value for each of the transparent films, a difference between the actual and the apparent height; and based on a relationship between the thicknesses of the transparent films and correction values thereof, obtaining the surface height of the transparent film by using a measured difference between an apparent height and an actual height of the substrate on which the transparent film is attached.

It is also preferable that the method further comprising a seventh step of detaching the transparent film from the substrate It is also preferable that, wherein, prior to the seventh step, ultraviolet rays are irradiated on the transparent film.

In accordance with another aspect of the invention, there is provided a storage medium for implementing, by driving a computer, the method for detecting the tip positions of the probes described above.

In accordance with still another aspect of the invention, there is provided a probe device for detecting tip positions of a plurality of probes, based on probe marks formed by the probes on a transparent film attached on a substrate having a plurality of electrodes arranged identical to those of a target object to be inspected, to perform an electrical characteristic test on the target object under a control of a control unit by making the probes contact with the target object, the device comprising: an imaging unit for imaging the substrate; a unit for obtaining a surface height of the transparent film; a unit for position-aligning the electrodes and the probes by capturing images of the substrate through the transparent film with the use of the imaging unit; a unit for forming probe marks on the transparent film by making the probes contact with the transparent film based on the surface height; and a unit for detecting the tip positions of the probes based on the electrodes and the probe marks formed on the transparent film.

It is also preferable that the probe device further includes a contact sensor for detecting a surface height of the transparent film by making a contact with a surface of the transparent film.

It is also preferable that the control unit includes a unit for calculating a surface height of the transparent film based on a refractive index of the transparent film and a difference between an actual height and an apparent height of the substrate measured by using the imaging unit. It is also preferable that the control unit further includes a unit for determining an overdriving amount of the substrate based on the surface height of the transparent film.

It is also preferable that the control unit further includes a unit for calculating a thickness of the transparent film of the substrate based on the detected value of the contact sensor; a unit for obtaining a thickness of the transparent film of the substrate based on detected values of a contact sensor; a unit for obtaining, as a correction value for a substrate height, the difference between the actual height and the apparent height of the substrate measured by using the imaging unit; and a unit for calculating the refractive index of the transparent film based on the thickness of the transparent film and the correction value.

It is also preferable that the control unit further includes a unit for storing therein thicknesses of a plurality of transparent films which are measured by using the contact sensor; a unit for storing therein thicknesses of a plurality of transparent films which are measured by using the contact sensor, the transparent films being of a same kind as that of the transparent film; a unit for storing therein, as a correction value, a difference between an actual height and an apparent height of the substrate which are measured by using the imaging unit for each of the transparent films; and a unit for obtaining, based on a relationship between the thicknesses of the transparent films and the correction values thereof, the surface height of the transparent film by using a measured difference between an actual height and an apparent height of the substrate on which the transparent film is attached.

It is also preferable that the probe device further includes a unit for irradiating ultraviolet rays on the transparent film.

In accordance with the aspects of the present invention, there can be provided a method for detecting tip positions of probes, a storage medium for storing the method and a probe device, the method capable of detecting a positional relationship between the probes and test electrodes of a test object at high speed and with high precision even at a high temperature and enhancing reliability of the test.

BRIEF DESCRIPTION OF THE DRAWINGS

The above and other objects and features of the present invention will become apparent from the following description of embodiments, given in conjunction with the accompanying drawings, in which:

FIGS. 6A and 6B show explanatory diagrams of detecting a test substrate through a transparent film, wherein FIGS. 6A and 6B illustrate an actual height and an apparent height of the test substrate, respectively;

DETAILED DESCRIPTION OF THE EMBODIMENTS

Hereinafter, the present invention will be described based on embodiments shown in FIGS. 1 to 8.

First Embodiment

Figure 1:
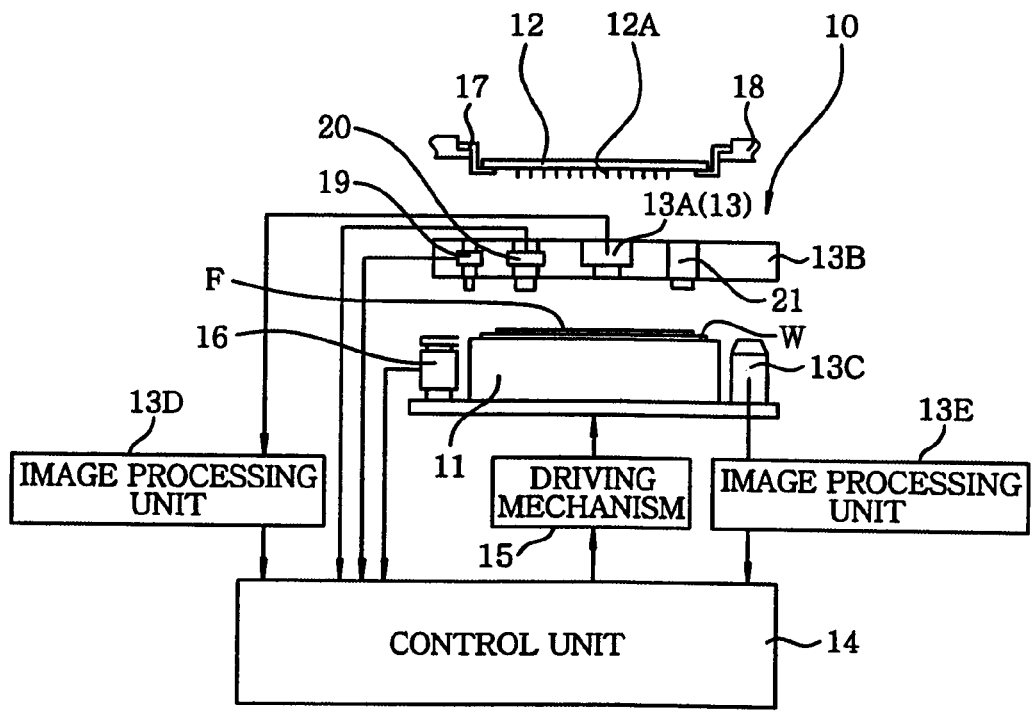
FIG. 1 shows a conceptual diagram of a probe device in accordance with an embodiment of the present invention.

First of all, a probe device of the present invention will be described. As shown in FIG. 1, a probe device 10 of this embodiment includes a movable mounting table 11 for mounting thereon a wafer (not shown) serving as a test object; a probe card 12 disposed above the mounting table 11; an alignment mechanism 13 for aligning a plurality of probes 12A of the probe card 12 with the wafer on the mounting table 11; and a control unit 14 for controlling the mounting table 11, the alignment mechanism 13 and the like.

The alignment mechanism 13 is driven under the control of the control unit 14 to align the wafer on the mounting table 11 with the probes 12A of the probe card 12 and, then, the probes 12A and the wafer are made to electrically contact with each other for an electrical characteristic test of the wafer. In this embodiment, when detecting probe marks of the probes 12A, a substrate (test substrate) W having thereon a transparent film F is mounted, instead of the wafer, on the mounting table 11, as shown in FIG. 1.

The mounting table 11 is configured to move in X, Y, Z and θ directions by a driving mechanism 15 driven under the control of the control unit 14. A load sensor (load cell) 16 is provided next to the mounting table 11 and detects heights of the ends of the probes 12A by making a contact with the probes 12A, for example. The probe card 12 is attached to a head plate 18 of a probe chamber via a card holder 17 and forms a horizontal surface by an automatic leveling mechanism (not shown).

The alignment mechanism 13 includes a first imaging unit (CCD camera) 13A fixed to an alignment bridge 13B; and a second imaging unit (CCD camera) 13C disposed at an opposite side of the load cell 16 in a circumferential direction of the mounting table 11. The first CCD camera 13A moves from an innermost part of the prober chamber toward a probe center by the alignment bridge 13B so as to be positioned between the probe card 12 and the mounting table 11.

While the mounting table 11 is moving in X and Y directions, images of test electrodes of the wafer are captured from the top by the first CCD camera 13A. Next, an image processing unit 13D processes the captured images and then transmits corresponding image signals to the control unit 14. Meanwhile, the second CCD camera 13C sequentially captures images of the plurality of the probes 12A from the bottom while the mounting table 11 is moving in X and Y directions. Thereafter, an image processing unit 13E processes the captured images and then transmits corresponding image signals to the control unit 14.

Further, a contact sensor (switch probe) 19 is attached to the alignment bridge 13B and detects a surface height of the test substrate W on the mounting table 11 or the like. Moreover, a laser detector 20 and an ultraviolet irradiation unit 21 are attached to the alignment bridge 13B. The laser detector 19 detects a surface height of the load cell 16, for example. The ultraviolet irradiation unit 21 degrades an adhesive of the transparent film used in the method for detecting tip positions of probes of the present invention, so that the transparent film can be easily detached from the test substrate W.

Moreover, the control unit 14 has a central processing unit and a storage unit. When the method for detecting tip positions of probes of the present invention is carried out, the central processing unit receives/transmits various information signals to/from each unit of the probe device 10, executes various operation processing, and, also, the storage unit stores therein various information such as the operation processing results and the like. The storage unit has a main storage unit and an auxiliary storage unit. The auxiliary unit includes a storage medium for implementing the method for detecting tip positions of probes of the present invention.

Hereinafter, the method for detecting tip positions of probes in accordance with an embodiment of the present invention will be explained with reference to FIGS. 2 to 8.

The method for detecting tip positions of probes of this embodiment is performed prior to the electrical characteristic test of the wafer. In this method, as for a test substrate for use in the detection of the tip positions of the probes, a substrate having electrodes arranged same as those of a wafer to be actually tested is used. Hereinafter, the test substrate is indicated by a notation "W".

Figure 2:
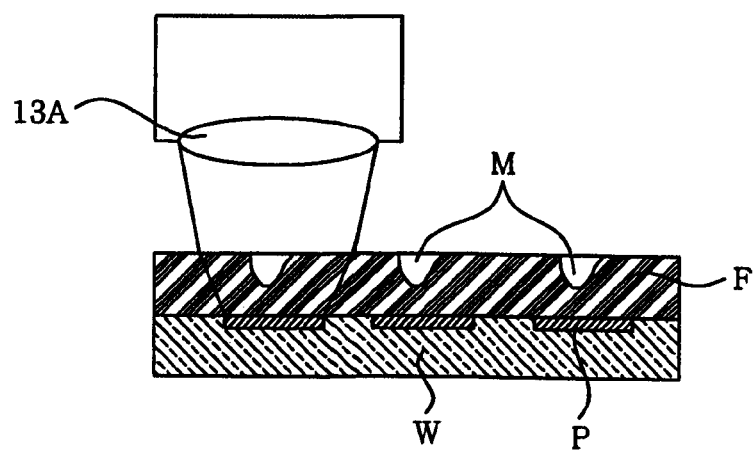
FIG. 2 describes a cross sectional view of principal parts in a method for detecting tip positions of probes in accordance with an embodiment of the present invention.

In the method of this embodiment, as shown in FIG. 2, a transparent film is attached on a surface of the test substrate W where a plurality of electrodes P are disposed and, then, the electrodes P and the probes 12A corresponding thereto are aligned with each other, thereby forming probe marks M on the transparent film F. Next, the electrodes P of the test substrate W across the transparent film F and the probe marks M are simultaneously detected by using the first CCD camera 13A (see FIG. 1) while index-transferring the test substrate W by moving the substrate W.

Since the electrodes P and the probe marks M are simultaneously observed by using the test substrate W having the electrodes P arranged same as those of an actual wafer, a positional relationship between the probe marks M and the electrodes P of the test substrate W can be detected with high precision. Therefore, in this method, there is no error accumulation caused by the transfer of the mounting table in contrast to a conventional method for detecting a plurality of probe marks formed on a transcription sheet or the like one after another while moving the mounting table along the probe marks.

Hereinafter, the method for detecting tip positions of probes of this embodiment will be described in detail with reference to FIGS. 3 to 8.

Above all, the transparent film F is attached on the surface of the test substrate W, as shown in FIG. 2. The transparent film F is made of a plastic material capable of maintaining its deformed shape. As for such a material, it is preferable to use synthetic resin such as ethylene vinyl acetate (EVA), polyethylene terephthalate (PET) or the like. EVA is used within a temperature range from, e.g., about −40° C. to about +70° C., and PET is used at a temperature higher than or equal to, e.g., about 70° C.

Next, the test substrate W is mounted on the mounting table 11 of the probe device 10. Before performing an alignment between the test substrate W and the probes 12A of the probe card 12, it is checked whether or not the probe card 12 is horizontal, as illustrated in FIGS. 3A to 3E.

Figure 3A:
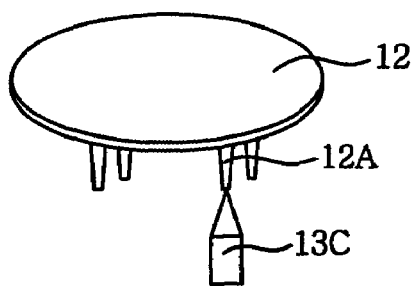
FIGS. 3A to 3E illustrate first half processes of the method for detecting tip positions of probes in accordance with the embodiment of the present invention.
Figure 3B:
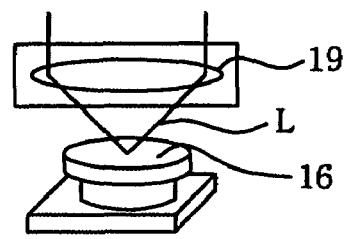

To be specific, as shown in FIG. 3A, the mounting table 11 is positioned under the probe card 12 and, then, the positions of the probes 12A of the probe card 12 in X and Y directions are detected by the second CCD camera 13C fixed on the mounting table 11. Next, as illustrated in FIG. 3B, the alignment bridge 13B moves toward the probe center and, then, the load cell 16 of the mounting table 11 is positioned directly under the laser detector 19 of the alignment bridge 13B by moving the mounting table 11. At this time, the laser detector 19 irradiates laser beam L toward the load cell 16 to measure a surface height of the load cell 16 in a reference position and, then, the alignment bridge 13B is retreated from the probe center. The measurement result is stored in the auxiliary storage unit of the control unit 14.

Figure 3C:
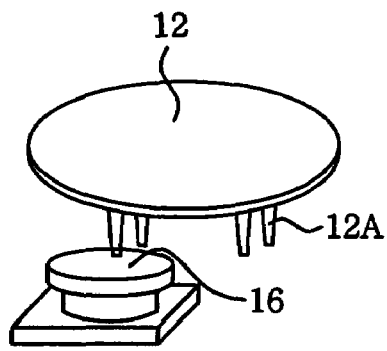
Figure 3D:
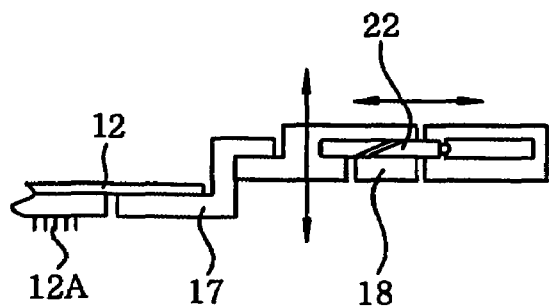

Thereafter, as illustrated in FIG. 3C, the load cell 16 is made to contact with each of the probes 12A at four corners one after another while moving the mounting table 11 under the control of the control unit 14, so that the positions of the probes 12A are detected one after another by the load cell 16. At this time, the central processing unit of the control unit 14 calculates the tip positions of the probes 12A based on a difference between the reference position of the load cell 16 and the detected positions of the probes 12A. When the probes 12A at four corners have different heights, an automatic leveling mechanism 22 is driven based on the height difference under the control of the control unit 14 to make the probes card 12 horizontal, as depicted in FIG. 3D.

Figure 3E:
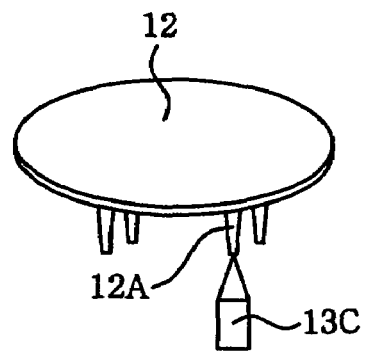

Next, as illustrated in FIG. 3E, the tip positions of the probes 12A at four corners are detected by the second CCD camera 13C; thereby ensuring that each of the probes 12A has a same height. Such a height is stored in the auxiliary storage unit of the control unit 14. After the probe card 12 becomes horizontal by the aforementioned series of operations, the electrodes P of the test substrate W are aligned with the probes 12A of the probe card 12, as shown in FIGS. 4A to 4D.

Figure 4A:
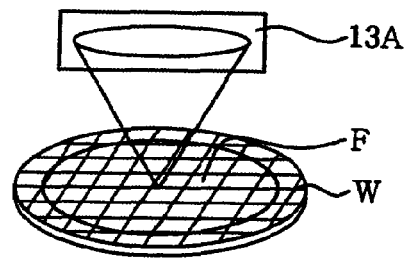
FIGS. 4A to 4D present second half processes of the method for detecting the tip positions of probes in accordance with the embodiment of the present invention.

To be specific, as described in FIG. 4A, the alignment bridge 13B moves toward the probe center and, then, the test substrate W is positioned directly under the first CCD camera 13A by moving the mounting table 11. Next, each of the electrodes of the test substrate W is detected through the transparent film F by the first CCD camera 13A while index-feeding the test substrate W by moving the mounting table 11 under the control of the control unit 14. Accordingly, the alignment between the test substrate W and the probes 12A is completed. Thereafter, the mounting table 11 is raised under the control of the control unit 14 to make the probes 12A contact with the transparent film F, so that the probe marks M are formed on the surface of the transparent film F. In order to leave the probe marks M on the transparent film F, a surface height of the transparent film F on the mounting table 11 needs to be detected and provided to the control unit 14.

Figure 4B:
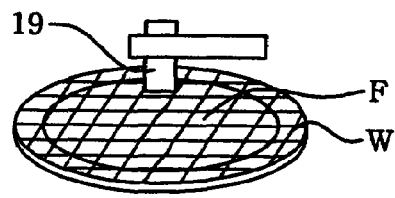

Therefore, in this embodiment, the surface height of the transparent film F is detected by using the switch probe 19 attached to the alignment bridge 13B, as shown in FIG. 4B. To be specific, tip height of the switch probe 19 is detected by using the second CCD camera 13C fixed on the mounting table 11. Next, the mounting table 11 is positioned directly under the switch probe 19 and then raised so that the transparent film F can contact with the switch probe 19 to detect the surface of the transparent film F. The central processing unit of the control unit 14 calculates the surface height of the transparent film F based on the height of the mounting table 11 obtained when detecting the switch probe 19 by using the second CCD camera 13C; and the height of the mounting table 11 obtained when detecting the surface of the transparent film F. The surface height thus obtained is stored in the auxiliary storage unit.

Figure 4C:
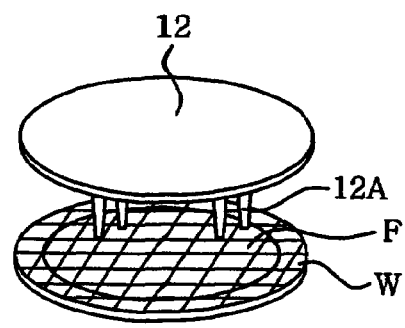

Thereafter, the central processing unit of the control unit 14 calculates a difference between the height of the probes 12A and the surface height of the transparent film F. By raising the mounting table 11 by as much as the height difference under the control of the control unit 14, the test substrate W is made to contact with the probes 12A, as illustrated in FIG. 4C. Further, by raising the mounting table 11 by as much as a preset overdriving amount under the control of the control unit 14, the probe marks M can be formed on the transparent film F, as shown in FIG. 2.

Figure 4D:
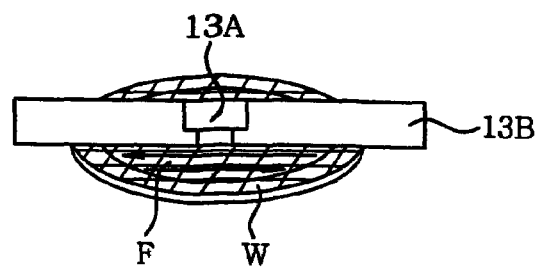

Next, as illustrated in FIG. 4D, the alignment bridge 13B is moved toward the probe center under the control of the control unit 14. When the mounting table 11 is index-transferred under the first CCD camera 13A at a high speed, the control unit 14 can simultaneously detect the electrodes P of the test substrate W and the probe marks M on the transparent film F at a high speed by using the first CCD camera 13A.

Based on the result thus obtained, it is possible to precisely check a positional relationship, e.g., a misalignment or the like, between the electrodes P of the test substrate W and the probe marks M. Further, by storing in the auxiliary storage unit of the control unit 14 position data of the tip positions of the probes 12A which are detected by means of the transparent film F, the electrode pads of the wafer can be precisely aligned with the probes 12A, which enhances reliability of the test.

After the tip positions of the probes 12A are detected by using the transparent film F based on the relationship between the probe marks M of the probes 12A and the electrodes P of the test substrate W, the alignment bridge 13B moves toward the probe center. Next, the mounting table 11 moves so that a central portion of the test substrate W can be positioned directly under the ultraviolet irradiation unit 21 of the alignment bridge 13B.

Figure 5A:
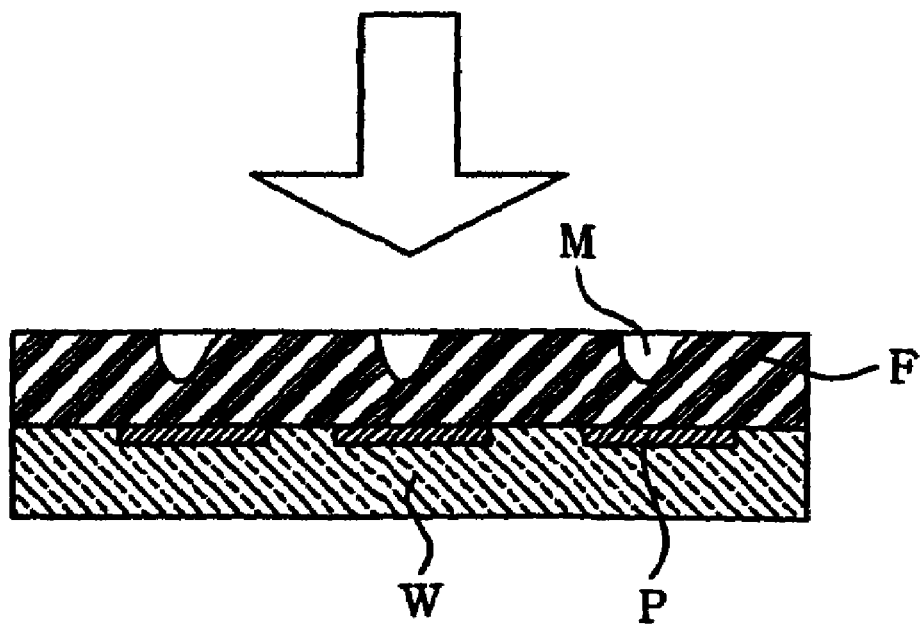
FIGS. 5A and 5B represent a final step of the method for detecting the tip positions of probes in accordance with the embodiment of the present invention.
Figure 5B:
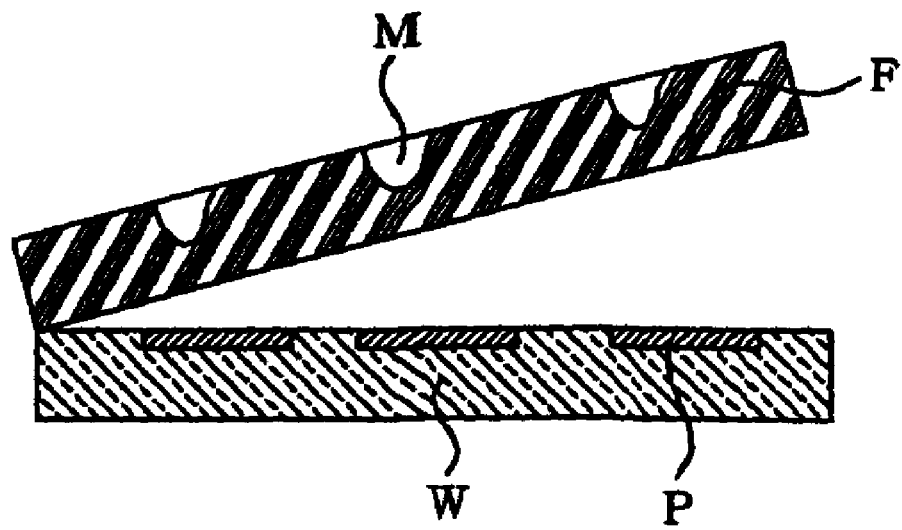

Thereafter, as indicated by an arrow of FIG. 5A, ultraviolet rays are irradiated from the ultraviolet irradiation unit 21 to the transparent film F, thus degrading the adhesive of the transparent film F. Accordingly, the transparent film F can be easily detached from the test substrate W, as shown in FIG.

5B. Thereafter, the test substrate W is separated from the mounting table 11. Since the transparent film F can be easily detached from the test substrate W without inflicting damages on the test substrate W, the test substrate W can be used repetitively.

As described above, in accordance with this embodiment, the method for detecting the tip positions of the probes which is performed prior to the wafer test includes a first step of attaching the transparent film F on the test substrate W having a plurality of electrodes P arranged same way as those of the wafer; a second step of detecting the electrodes P of the test substrate W through the transparent film F by using the first CCD camera 13A; a third step of detecting a surface height of the transparent film F by using the switch probe 19; a fourth step of position-aligning the electrodes P of the test substrate W with the probes 12A; a fifth step of forming the probe marks M on the transparent film F by making the probes 12A contact with the transparent film F by way of raising the mounting table 11 based on the surface height of the transparent film F; and a sixth step of detecting the tip positions of the probes 12A based on the electrodes P of the test substrate W and the probe marks M of the transparent film F.

Accordingly, even at a high temperature, the first CCD camera 13A can detect the tip positions of the probes 12A at high speed and with high precision by using the electrodes P formed on the test substrate W with high precision by moving the mounting table 11 at high speed while index-feeding. As a consequence, the electrode pads of the wafer can electrically contact with the probes 12A corresponding thereto without a misalignment during subsequent wafer tests, which further makes it possible to perform a test having high reliability.

Further, since the transparent film F can be easily detached from the test substrate W by irradiating ultraviolet rays from the ultraviolet irradiation unit 21 to the test substrate W through the transparent film F, the test substrate W can be used repetitively.

Second Embodiment

Although the first embodiment has the third step of measuring the surface height of the transparent film F by using the switch probe 19 and then detecting the positions of the probes, the second embodiment has a third step of measuring the surface height of the transparent film F by using a refractive index of the transparent film F and then detecting the positions of the probes. Since the second embodiment is same as the first embodiment except that the surface height of the transparent film F is obtained by using the refractive index of the transparent film F, the difference will be mainly explained hereinafter.

Figure 6A:
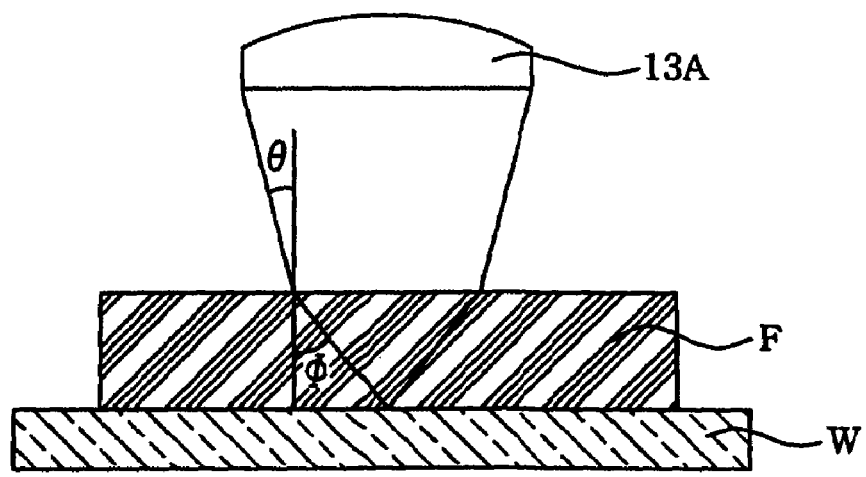
Figure 6B:
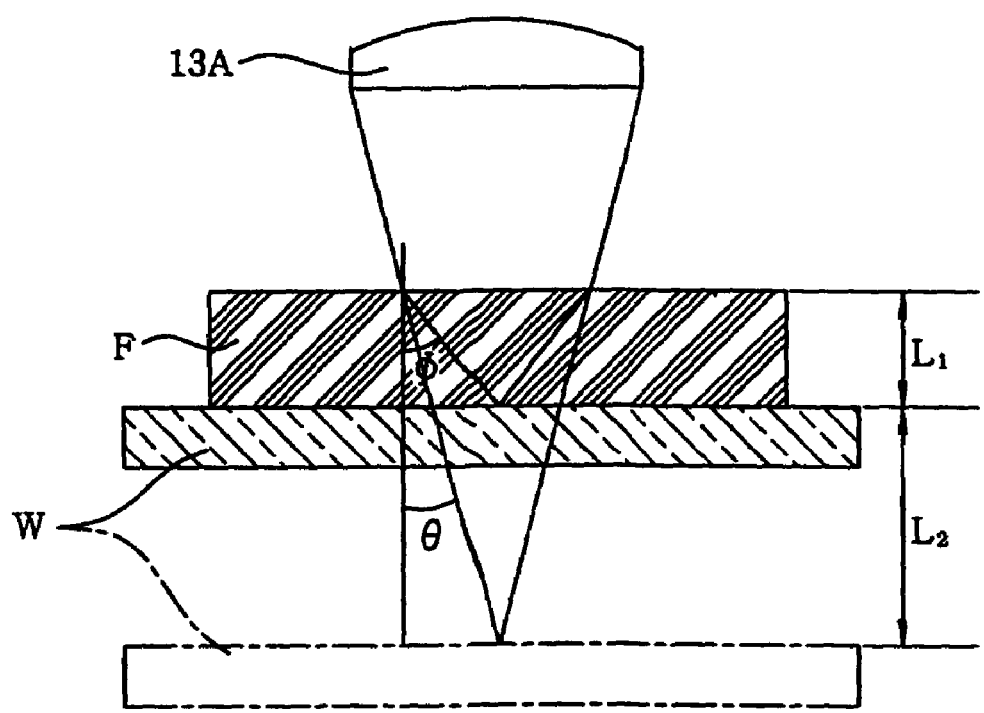

When the electrodes P of the test substrate W are detected through the transparent film F by the first CCD camera 13A, light is refracted by the transparent film F, as shown in FIGS. 2 and 6A, which hinders a detection of an actual surface height of the test substrate W. Therefore, the control unit 14 detects an apparent surface height of the test substrate W, as shown in FIG. 6B.

Moreover, since the surface of the transparent film F is not detected by the first CCD camera 13A, the actual surface height of the transparent film F is not obtained. Instead, the actual surface height of the transparent film F can be obtained by correcting the apparent surface height of the test substrate W by using the refractive index of the transparent film F. The probe marks and the electrodes are omitted in FIGS. 6A and 6B.

Figure 7A:
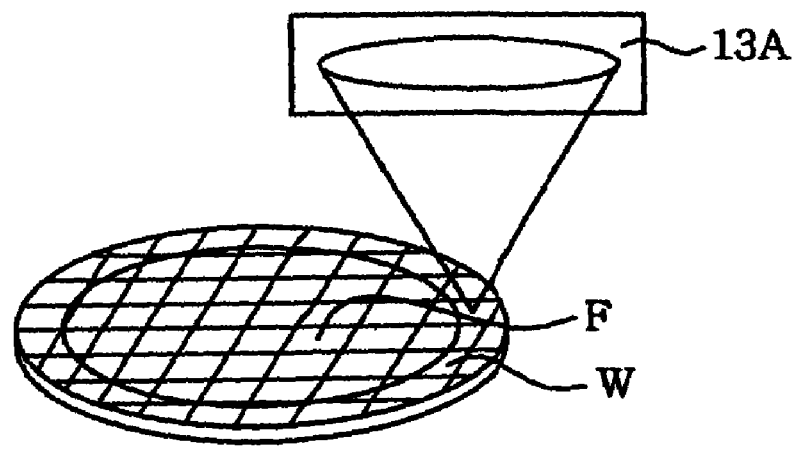
FIGS. 7A and 7B depict perspective views of detecting an actual surface height and an apparent surface height of the test substrate by using a CCD camera, respectively.

In other words, since a numerical aperture NA (=sin θ) of the first CCD camera 13A is known, the central processing unit of the control unit 14 can calculate a thickness L1 of the transparent film F by using the numerical aperture NA and a refractive index n of the transparent film F. Since the refractive index n of the transparent film F is known, following Eq. 1 is obtained based on the relationship shown in FIG. 6B.

$$L1 \times \tan \phi = (L1+L2) \times \tan \theta \qquad \text{Eq. 1,}$$

wherein tan φ and tan θ are known and, also, L2 can be measured by using the first CCD camera 13A. To be specific, as shown in FIG. 7A, when the test substrate W is detected at the outside of the transparent film F by using the first camera 13A, an actual surface height of the test substrate W disposed at a position indicated by a dashed dotted line in FIG. 6B is detected. At that moment, the position of the mounting table 11 is stored in the auxiliary storage unit. Next, when the test substrate W is detected through the transparent film F with the use of the first CCD camera 13A by moving the mounting table 11, an apparent height of the test substrate W shown in FIG. 6A is detected.

The position of the mounting table 11 at that moment is stored in the auxiliary storage unit. The central processing unit can calculate L2 by subtracting the detected height of the test substrate W positioned as indicated by a dashed dotted line shown in FIG. 6B from that shown in FIG. 6A. Since tan φ, tan θ and L2 are known, a thickness L1 of the transparent film F can be calculated by substituting those values in Eq. 1.

As described, the actual height of the test substrate W can be calculated by correcting, based on the correction value L2, the apparent surface height of the test substrate W of FIG. 6B which is detected through the transparent film F. Further, the surface height of the transparent film F can be calculated by adding the thickness L1 of the transparent film F which is obtained in Eq. 1 to the actual height of the test substrate W. Accordingly, the overdriving amount of the test substrate W can be precisely set based on the surface height of the test substrate W and that of the transparent film F. Thereafter, the probes 12A can leave the probe marks M on the surface of the transparent film F in the sequence same as that of the first embodiment. In other words, if the refractive index n of the transparent film F is known, the surface height of the transparent film F can be calculated by using the first CCD camera 13A and, further, the overdriving amount of the test substrate W can be precisely set. As a result, the effects of the first embodiment can also be obtained by the second embodiment.

Figure 8A:
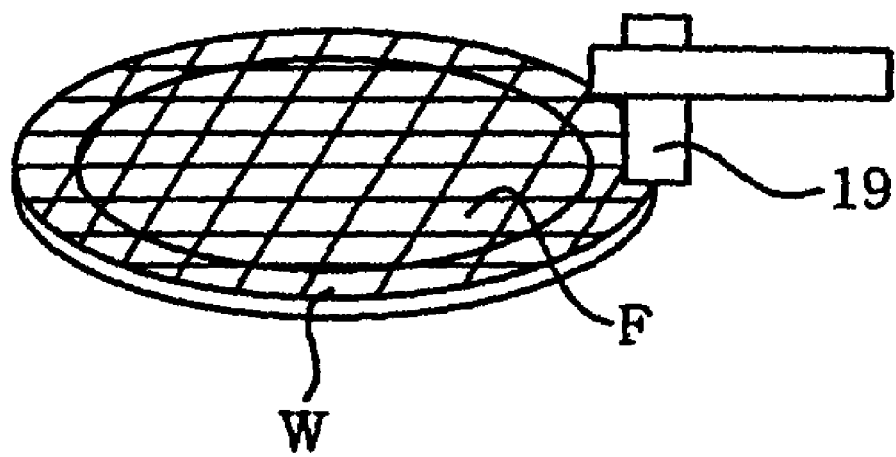
FIGS. 8A and 8B offer perspective views of detecting a thickness of the transparent film by using a switch probe.
Figure 8B:
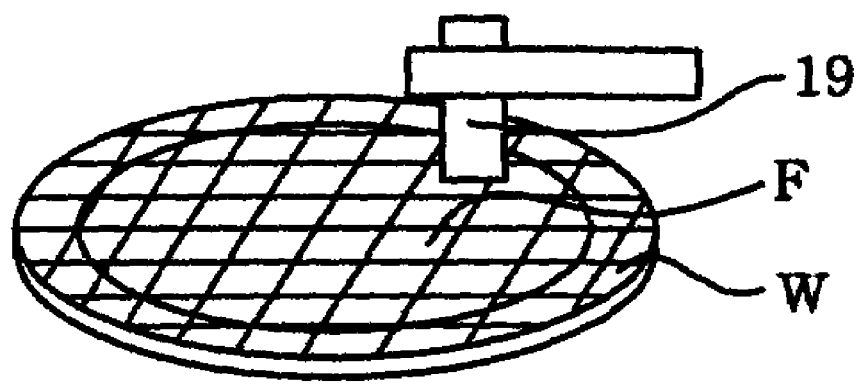

As shown in FIGS. 8A and 8B, the thickness L1 of the transparent film F can be obtained by using the switch probe 19. To be specific, as shown in FIG. 8A, the switch probe 19 is made to contact with the test substrate W at the outside of the transparent film F and detects the surface height of the test substrate W. Next, the switch probe 19 is positioned above the transparent film F by moving the mounting table 11 and then made to contact with the transparent film F by raising the mounting table 11, thereby detecting the surface height of the transparent film F. The thickness L1 of the transparent film F can be obtained by subtracting the surface height of the test substrate W from that of the transparent film F.

Hence, the surface height of the transparent film F can be simply obtained by using the first CCD camera 13A and the switch probe 19.

Third Embodiment

This embodiment has a feature in that a refractive index n of the transparent film F is obtained when it is unknown. In this case, since the refractive index n of the transparent film F is not known, the thickness L1 of the transparent film F and the correction value L2 of the height of the test substrate W need to be measured as can be seen from Eq. 1.

Figure 7B:
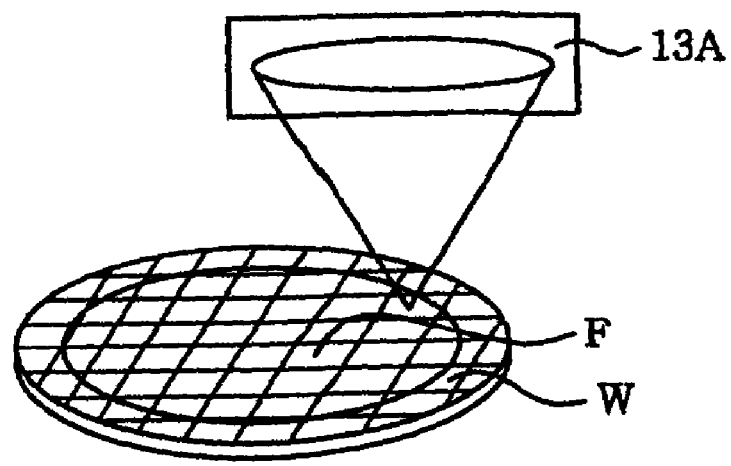

To do so, the correction value L2 on the height of the test substrate W needs to be obtained by using the first CCD camera 13A in accordance with the method shown in FIGS. 7A and 7B and, also, the thickness L1 of the transparent film F needs to be obtained by using the switch probe 19 in accordance with the method described with reference to FIGS. 8A and 8B. Since the numerical aperture of the first CCD camera 13A is known, $\tan \phi$ can be obtained by substituting the known values in Eq. 1. The refractive index n ($=\sin \phi/\sin \theta$) of the transparent film F can be calculated based on $\tan \theta$ and the equation, i.e., $n=\sin \phi/\sin \theta$ The thickness L1 and the refractive index n of the transparent film F vary depending on a temperature. Therefore, a relationship between a thickness of the transparent film F and a temperature and a relationship between a refractive index n and a temperature are obtained in accordance with the aforementioned methods and then stored in the auxiliary storage unit. Accordingly, it is easy to obtain a thickness L1 and a refractive index n of the transparent film F in any temperature based on the stored relationships. Also, it is easy to obtain the surface height of the transparent film F.

Besides, a plurality of transparent films F having different thicknesses are provided and, then, each of the thicknesses of the transparent films F is measured by using the switch probe 19. Further, correction values L2 for height of the test substrate W are measured by using the first CCD camera 13A. Next, a refractive index n of the transparent films F is calculated by substituting those values in Eq. 1.

Moreover, the thicknesses L1 of the transparent films F and the correction values L2 for height of the test substrate W are plotted in a horizontal and a vertical axis, respectively, so that the relationship therebetween can be obtained. Accordingly, surface heights of the transparent films can be calculated by using a difference between an actual height and an apparent height of the test substrate W based on the relationship between the thicknesses L1 of the transparent films F and the correction values L2 thereof.

Further, a relationship between the thickness L1 of the transparent film F and the correction value L2 for height of the test substrate W can be obtained by using Eq. 1. Based on the relationship thus obtained, it is easy to obtain the correction value L2 in any thickness and the actual surface height of the transparent film F.

Further, the present invention is not limited to the above-described embodiment and can have modified components if necessary.

The present invention can be appropriately used for a probe device for performing an electrical characteristic test of a test object such as a semiconductor wafer or the like.

While the invention has been shown and described with respect to the embodiments, it will be understood by those skilled in the art that various changes and modification may be made without departing from the scope of the invention as defined in the following claims.

What is claimed is:

1. A method for detecting tip positions of a plurality of probes to perform an electrical characteristic test on a target object to be inspected by making the probes electrically contact with the target object, the method comprising:

a first step of attaching a transparent film on a substrate having a plurality of electrodes arranged identical to those of the target object;

a second step of detecting the electrodes of the substrate through the transparent film by using an imaging unit;

a third step of obtaining a surface height of the transparent film;

a fourth step of position-aligning the probes and the electrodes of the substrate which are detected in the second step;

a fifth step of forming probe marks on the transparent film by making the probes contact with the transparent film based on the surface height; and a sixth step of detecting the tip positions of the probes based on the electrodes and the probe marks on the transparent film.

2. The method of claim 1, wherein in the third step, the surface height of the transparent film is obtained by making a contact sensor contact with a surface of the transparent film.

3. The method of claim 1, wherein the third step includes the steps of:

measuring an apparent height and an actual height of the substrate by using the imaging unit, and calculating the surface height of the transparent film based on a refractive index of the transparent film and a difference between the measured heights.

4. The method of claim 3, further comprising, prior to the third step, the steps of:

measuring a thickness of another transparent film attached on the substrate by using a contact sensor, said another transparent film being of a same kind as that of the transparent film attached in the fist step;

obtaining, as a correction value for a substrate height, a difference between an actual height and an apparent height of the substrate, on which said another transparent film is attached, measured by using the imaging unit; and obtaining the refractive index of the transparent film based on the thickness of said another transparent film and the correction value, wherein, in the third step, the surface height of the transparent film attached in the first step is calculated based on the refractive index thus obtained.

5. The method of claim 1, wherein, prior to the fourth step, an overdriving amount of the substrate is determined based on the surface height of the transparent film.

6. The method of claim 1, wherein, the third step includes the steps of:

measuring in advance respective thicknesses of transparent films having varying thicknesses by using a contact sensor, the transparent films being of a same kind as that of the transparent film;

measuring an apparent height and an actual height of the substrate for each of the transparent films by using the imaging unit and obtaining, as a correction value for each of the transparent films, a difference between the actual and the apparent height; and based on a relationship between the thicknesses of the transparent films and correction values thereof, obtaining the surface height of the transparent film by using a measured difference between an apparent height and an actual height of the substrate on which the transparent film is attached.

7. The method of claim 1, further comprising a seventh step of detaching the transparent film from the substrate.

8. The method of claim 7, wherein, prior to the seventh step, ultraviolet rays are irradiated on the transparent film.

9. A storage medium for implementing, by driving a computer, the method for detecting the tip positions of the probes disclosed in claim 1.

10. A probe device for detecting tip positions of a plurality of probes, based on probe marks formed by the probes on a transparent film attached on a substrate having a plurality of electrodes arranged identical to those of a target object to be inspected, to perform an electrical characteristic test on the target object under a control of a control unit by making the probes contact with the target object, the device comprising:
  an imaging unit for imaging the substrate;
  a unit for obtaining a surface height of the transparent film;
  a unit for position-aligning the electrodes and the probes by capturing images of the substrate through the transparent film with the use of the imaging unit;
  a unit for forming probe marks on the transparent film by making the probes contact with the transparent film based on the surface height; and
  a unit for detecting the tip positions of the probes based on the electrodes and the probe marks formed on the transparent film.

11. The probe device of claim 10, further comprising a contact sensor for detecting a surface height of the transparent film by making a contact with a surface of the transparent film.

12. The probe device of claim 10, wherein the control unit includes a unit for calculating the surface height of the transparent film based on a refractive index of the transparent film and a difference between an actual height and an apparent height of the substrate measured by using the imaging unit.

13. The probe device of claim 12, wherein the control unit further includes:
  a unit for obtaining a thickness of the transparent film of the substrate based on detected values of a contact sensor;
  a unit for obtaining, as a correction value for a substrate height, the difference between the actual height and the apparent height of the substrate measured by using the imaging unit; and
  a unit for calculating the refractive index of the transparent film based on the thickness of the transparent film and the correction value.

14. The probe device of claim 10, wherein the control unit further includes a unit for determining an overdriving amount of the substrate based on the surface height of the transparent film.

15. The probe device of claim 10, wherein the control unit further includes:
  a unit for storing therein thicknesses of a plurality of transparent films which are measured by using the contact sensor, the transparent films being of a same kind as that of the transparent film;
  a unit for storing therein, as a correction value, a difference between an actual height and an apparent height of the substrate which are measured by using the imaging unit for each of the transparent films; and
  a unit for obtaining, based on a relationship between the thicknesses of the transparent films and the correction values thereof, the surface height of the transparent film by using a measured difference between an actual height and an apparent height of the substrate on which the transparent film is attached.

16. The probe device of claim 10, further comprising a unit for irradiating ultraviolet rays on the transparent film.

* * * * *